United States Patent
Kim et al.

(10) Patent No.: US 11,227,546 B2
(45) Date of Patent: Jan. 18, 2022

(54) ORGANIC LIGHT EMITTING DISPLAY DEVICE AND METHOD OF DRIVING THE SAME

(71) Applicant: Samsung Display Co., Ltd., Yongin-si (KR)

(72) Inventors: Jiwoong Kim, Suwon-si (KR); Ohjo Kwon, Suwon-si (KR); Jeon Kyoo Kim, Seoul (KR); Jae Keun Lim, Suwon-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 0 days.

(21) Appl. No.: 16/593,651

(22) Filed: Oct. 4, 2019

(65) Prior Publication Data

US 2020/0118488 A1    Apr. 16, 2020

(30) Foreign Application Priority Data

Oct. 12, 2018    (KR) .................. 10-2018-0121666

(51) Int. Cl.
*G09G 3/3233*    (2016.01)
*H01L 27/32*    (2006.01)
(Continued)

(52) U.S. Cl.
CPC ......... *G09G 3/3233* (2013.01); *G09G 3/3266* (2013.01); *G09G 3/3291* (2013.01); *H01L 27/3248* (2013.01); *H01L 27/3262* (2013.01); *H01L 27/3265* (2013.01); *H01L 27/3276* (2013.01); *G09G 2310/0278* (2013.01); *G09G 2310/0286* (2013.01); *G09G 2310/08* (2013.01);
(Continued)

(58) Field of Classification Search
CPC .. G09G 3/3233; G09G 3/3266; G09G 3/3291; H01L 27/3248; H01L 27/3262; H01L 27/3265; H01L 27/3276
USPC .............. 345/76, 175, 212, 211; 324/762.01; 702/151
See application file for complete search history.

(56) References Cited

U.S. PATENT DOCUMENTS 3,323,059 A  *  5/1967  Erickson ............ G01R 31/2632
                                                           324/762.01
10,510,303 B2 * 12/2019 Kim .................... G01R 19/0092
(Continued)

FOREIGN PATENT DOCUMENTS

KR    10-2014-0077458 A    6/2014
KR       1020140077458 A  *  6/2014    ............... G09G 3/30
(Continued)

*Primary Examiner* — Prabodh M Dharia
(74) *Attorney, Agent, or Firm* — Lewis Roca Rothgerber Christie LLP

(57) ABSTRACT

An organic light emitting display device includes a display part including a plurality of scan lines, a plurality of data lines, a plurality of power source lines, and a plurality of pixels each including an organic light emitting diode, a driving transistor coupled to the organic light emitting diode and to a power source line of the power source lines, and a switching transistor coupled to a scan line of the scan lines and to a data line of the data lines, and a sensing driver configured to sample a sensing current from the power source line while a sensing data voltage is applied to one of the pixels, and to calculate a threshold voltage value of the driving transistor using the sensing current in a sensing mode.

20 Claims, 7 Drawing Sheets

(51) Int. Cl.
  *G09G 3/3266* (2016.01)
  *G09G 3/3291* (2016.01)
(52) U.S. Cl.
  CPC ... *G09G 2320/045* (2013.01); *G09G 2330/12* (2013.01)

(56) References Cited

U.S. PATENT DOCUMENTS

| | | | | |
|---|---|---|---|---|
| 2005/0278137 | A1* | 12/2005 | Hammerschmidt | ........................ G01D 5/24452 702/151 |
| 2009/0085894 | A1* | 4/2009 | Gandhi | ................... G06F 3/041 345/175 |
| 2010/0073346 | A1* | 3/2010 | Min | ..................... G09G 3/3291 345/211 |
| 2010/0097350 | A1* | 4/2010 | Choi | ..................... G06F 3/0412 345/175 |
| 2013/0321379 | A1* | 12/2013 | Van Lier | ................. G09G 3/00 345/212 |
| 2015/0029171 | A1* | 1/2015 | Jo | ........................ G09G 3/3258 345/212 |
| 2015/0179105 | A1* | 6/2015 | Mizukoshi | ........... G09G 3/3266 345/76 |
| 2016/0042690 | A1* | 2/2016 | Chang | .................. G09G 3/3233 345/212 |
| 2016/0086540 | A1* | 3/2016 | Kim | ..................... G09G 3/3233 345/214 |
| 2016/0163265 | A1* | 6/2016 | Yang | ..................... G09G 3/3233 345/690 |
| 2017/0004764 | A1* | 1/2017 | Kim | ..................... G09G 3/3233 |
| 2017/0076660 | A1* | 3/2017 | Lee | ...................... G09G 3/3208 |
| 2017/0329439 | A1* | 11/2017 | Jeong | .................... G06F 3/0445 |
| 2019/0304362 | A1* | 10/2019 | Yuan | .................... G09G 3/3233 |
| 2019/0325822 | A1* | 10/2019 | Li | ........................ G09G 3/3266 |

FOREIGN PATENT DOCUMENTS

| | | |
|---|---|---|
| KR | 10-1606766 B1 | 4/2016 |
| KR | 10-2016-0084941 A | 7/2016 |
| KR | 10-2017-0032509 A | 3/2017 |
| KR | 10-1941446 B1 | 1/2019 |

\* cited by examiner

ORGANIC LIGHT EMITTING DISPLAY DEVICE AND METHOD OF DRIVING THE SAME

CROSS-REFERENCE TO RELATED APPLICATION

This application claims priority to, and the benefit of, Korean Patent Application No. 10-2018-0121666 filed on Oct. 12, 2018, which is hereby incorporated by reference for all purposes as if fully set forth herein.

BACKGROUND

1. Field

Embodiments of the present disclosure relate to an organic light emitting display device and a method of driving the organic light emitting display device. More particularly, embodiments of the present disclosure relate to an organic light emitting display device for improving a display quality and a method of driving the organic light emitting display device.

2. Description of the Related Art

An organic light emitting display device is an apparatus for displaying an image using an organic light emitting diode. The characteristics of the organic light emitting diode and of a driving transistor that supplies current to the organic light emitting diode may be deteriorated by use. Accordingly, the organic light emitting display device may not display an image having a desired luminance due to deterioration of the organic light emitting diode or of the driving transistor.

The organic light emitting display device applies a reference signal to the pixels, measures the current flowing through each of the pixels according to the reference signal, determines deterioration of the pixel based on the measured current, and compensates for deterioration of the pixel.

A deterioration compensation method may include an internal compensation method using a compensation circuit located in a pixel, and/or an external compensation method using a compensation circuit located outside the panel to simplify a circuit structure in a pixel.

SUMMARY

Embodiments of the present disclosure provide an organic light emitting display device that senses a current flowing in a power supply voltage line of a display part, and that performs image quality compensation.

Embodiments of the present disclosure provide a method of driving the organic light emitting display device.

According to an embodiment of the present disclosure, there is provided an organic light emitting display device including a display part including a plurality of scan lines, a plurality of data lines, a plurality of power source lines, and a plurality of pixels each including an organic light emitting diode, a driving transistor coupled to the organic light emitting diode and to a power source line of the power source lines, and a switching transistor coupled to a scan line of the scan lines and to a data line of the data lines, and a sensing driver configured to sample a sensing current from the power source line while a sensing data voltage is applied to one of the pixels, and to calculate a threshold voltage value of the driving transistor using the sensing current in a sensing mode.

The organic light emitting display device may further include a data driver configured to respectively apply sensing data voltages that are different from each other to the data line in at least two periods of the sensing mode, and a scan driver circuit configured to respectively apply a scan-on voltage to the scan line at least two times respectively corresponding to the at least two periods of the sensing mode.

In a first period of the sensing mode, a first sensing data voltage may be applied to the data line, a first scan-on voltage is applied to the scan line in synchronization with the first sensing data voltage, and a power source voltage is applied to the power source line.

In the first period, the sensing driver may be configured to sample a first sensing current corresponding to the first sensing data voltage from the power source line, and to convert the first sensing current to a first current value.

In a second period of the sensing mode, a second sensing data voltage that is different from the first sensing data voltage may be applied to the data line, a second scan-on voltage is applied to the scan line in synchronization with the second sensing data voltage, and a power source voltage is applied to the power source line.

In the second period, the sensing driver may be configured to sample a second sensing current corresponding to the second sensing data voltage from the power source line, and to convert the second sensing current to a second current value.

The sensing driver may be configured to calculate a first point that includes a first gate voltage being an x-coordinate value and the first current value being a y-coordinate value, calculate a second point that includes a second gate voltage being an x-coordinate value and the second current value being a y-coordinate value, calculate a slope of the first and second points, and calculate a threshold voltage value of the driving transistor using the slope.

The organic light emitting display device may further include a timing controller configured to calculate a correction offset value using the threshold voltage value, and to correct image data using the correction offset value.

The switching transistor may include a control electrode coupled to the scan line, a first electrode coupled to the data line, and a second electrode, and the driving transistor may include the control electrode coupled to the second electrode of the switching transistor, a first electrode coupled to the power source line, and a second electrode coupled to an anode electrode of the organic light emitting diode.

Each of the pixels may further include a storage capacitor connected between the control electrode of the driving transistor and the second electrode of the driving transistor.

The plurality of power source lines may be coupled to each other through a common connection line formed in a peripheral part surrounding the display part, and the sensing driver may sample a sensing current from the common connection line.

According to an embodiment of the present disclosure, there is provided a method of driving the organic light emitting display device that includes a scan line, a data line, a power source line, and a pixel including an organic light emitting diode, a driving transistor coupled to the organic light emitting diode and to a power source line, and a switching transistor coupled to a scan line and to a data line, the method including sampling a sensing current from the power source line while a sensing data voltage is applied to the pixel in a sensing mode, and calculating a threshold voltage value of the driving transistor using the sensing current in the sensing mode.

The method may further include respectively applying sensing data voltages that are different from each other to the data line in at least two periods of the sensing mode, and respectively applying a scan-on voltage to the scan line at least two times respectively corresponding to the at least two periods of the sensing mode.

The method may further include applying a first sensing data voltage to the data line in a first period of the sensing mode, applying a first scan-on voltage to the scan line in synchronization with the first sensing data voltage in the first period, and applying a power source voltage to the power source line in the first period.

The method may further include sampling a first sensing current corresponding to the first sensing data voltage from the power source line in the first period, and converting the first sensing current to a first current value in the first period.

The method may further include applying a second sensing data voltage that is different from the first sensing data voltage to the data line in a second period of the sensing mode, applying a second scan-on voltage to the scan line in synchronization with the second sensing data voltage in the second period, and applying a power source voltage is applied to the power source line in the second period.

The method may further include sampling a second sensing current corresponding to the second sensing data voltage from the power source line in the second period, and converting the second sensing current to a second current value in the second period.

The method may further include calculating a first point that includes a first gate voltage being an x-coordinate value and the first current value being a y-coordinate value in a third period of the sensing mode, calculating a second point that includes a second gate voltage being an x-coordinate value and the second current value being a y-coordinate value in the third period, calculating a slope of the first and second points in the third period, and calculating a threshold voltage value of the driving transistor using the slope in the third period.

The method may further include calculating a correction offset value using the threshold voltage value, and correcting image data using the correction offset value.

A plurality of power source lines may be coupled to each other through a common connection line formed in a peripheral part surrounding a display part, and the sensing current may be sampled from the common connection line of the organic light emitting display device.

According to the embodiments of the present disclosure, the power supply current flowing in the power source line of the display part may be sensed, and the threshold voltage for measuring the deterioration of the transistor may be calculated using the sensed power supply current. In addition, a high-resolution display panel may be manufactured without adding a sensing transistor and a sensing line to a pixel circuit.

BRIEF DESCRIPTION OF THE DRAWINGS

The above and other aspects of the present disclosure will become more apparent by describing in detailed embodiments thereof with reference to the accompanying drawings, in which.

DETAILED DESCRIPTION

Figure 1:
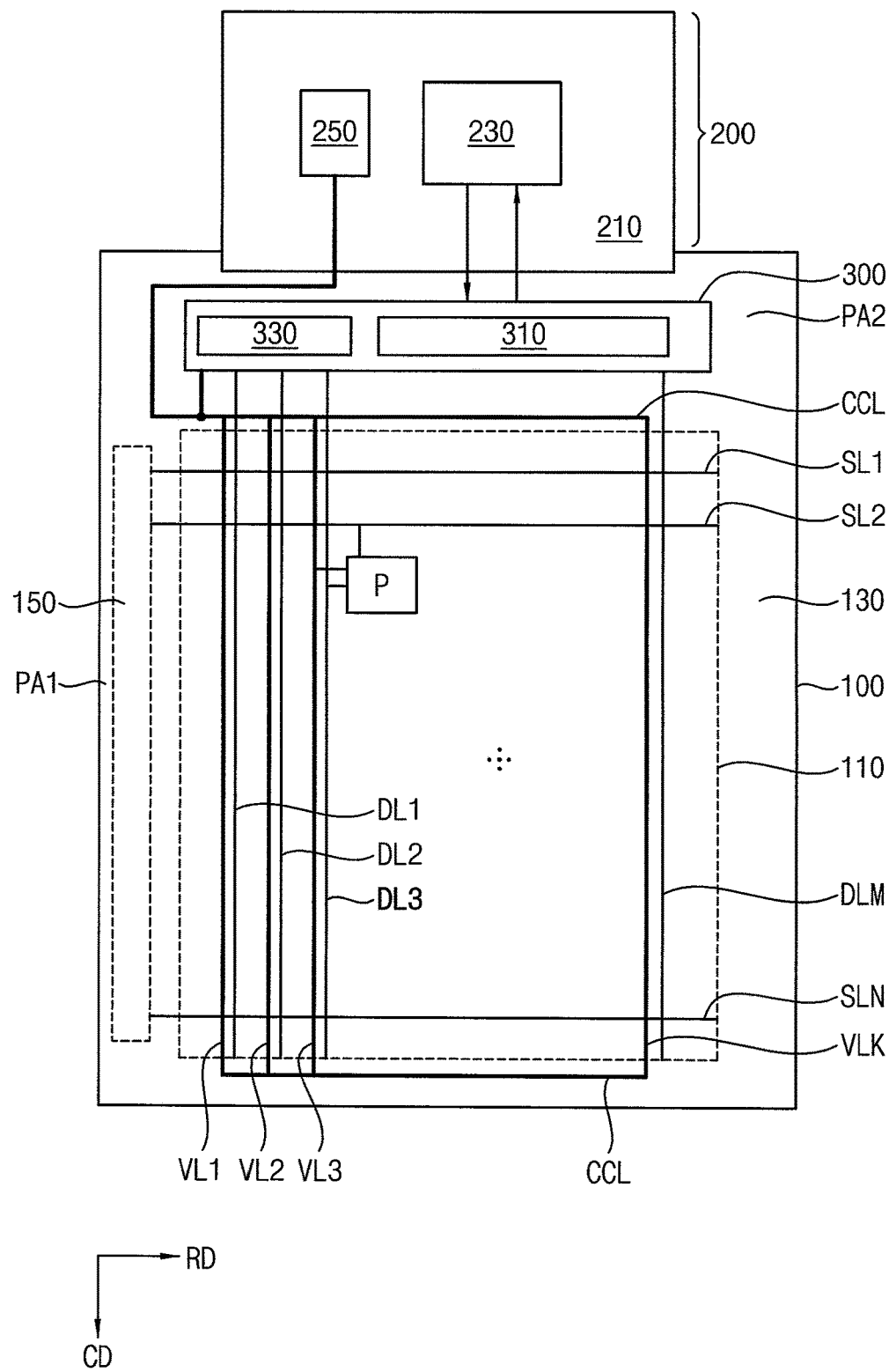
FIG. 1 is a plan view illustrating an organic light emitting display device according to one embodiment.

Features of the inventive concept and methods of accomplishing the same may be understood more readily by reference to the detailed description of embodiments and the accompanying drawings. Hereinafter, embodiments will be described in more detail with reference to the accompanying drawings. The described embodiments, however, may be embodied in various different forms, and should not be construed as being limited to only the illustrated embodiments herein. Rather, these embodiments are provided as examples so that this disclosure will be thorough and complete, and will fully convey the aspects and features of the present inventive concept to those skilled in the art. Accordingly, processes, elements, and techniques that are not necessary to those having ordinary skill in the art for a complete understanding of the aspects and features of the present inventive concept may not be described. Unless otherwise noted, like reference numerals denote like elements throughout the attached drawings and the written description, and thus, descriptions thereof will not be repeated. Further, parts not related to the description of the embodiments might not be shown to make the description clear. In the drawings, the relative sizes of elements, layers, and regions may be exaggerated for clarity.

Various embodiments are described herein with reference to sectional illustrations that are schematic illustrations of embodiments and/or intermediate structures. As such, variations from the shapes of the illustrations as a result, for example, of manufacturing techniques and/or tolerances, are to be expected. Further, specific structural or functional descriptions disclosed herein are merely illustrative for the purpose of describing embodiments according to the concept of the present disclosure. Thus, embodiments disclosed herein should not be construed as limited to the particular illustrated shapes of regions, but are to include deviations in shapes that result from, for instance, manufacturing. For example, an implanted region illustrated as a rectangle will, typically, have rounded or curved features and/or a gradient of implant concentration at its edges rather than a binary change from implanted to non-implanted region. Likewise, a buried region formed by implantation may result in some implantation in the region between the buried region and the surface through which the implantation takes place. Thus, the regions illustrated in the drawings are schematic in nature and their shapes are not intended to illustrate the actual shape of a region of a device and are not intended to be limiting. Additionally, as those skilled in the art would realize, the described embodiments may be modified in various different ways, all without departing from the spirit or scope of the present disclosure.

In the detailed description, for the purposes of explanation, numerous specific details are set forth to provide a thorough understanding of various embodiments. It is apparent, however, that various embodiments may be practiced without these specific details or with one or more equivalent arrangements. In other instances, well-known structures and devices are shown in block diagram form in order to avoid unnecessarily obscuring various embodiments.

It will be understood that, although the terms "first," "second," "third," etc., may be used herein to describe various elements, components, regions, layers and/or sections, these elements, components, regions, layers and/or sections should not be limited by these terms. These terms are used to distinguish one element, component, region, layer or section from another element, component, region, layer or section. Thus, a first element, component, region, layer or section described below could be termed a second element, component, region, layer or section, without departing from the spirit and scope of the present disclosure.

It will be understood that when an element, layer, region, or component is referred to as being "on," "connected to," or "coupled to" another element, layer, region, or component, it can be directly on, connected to, or coupled to the other element, layer, region, or component, or one or more intervening elements, layers, regions, or components may be present. However, "directly connected/directly coupled" refers to one component directly connecting or coupling another component without an intermediate component. Meanwhile, other expressions describing relationships between components such as "between," "immediately between" or "adjacent to" and "directly adjacent to" may be construed similarly. In addition, it will also be understood that when an element or layer is referred to as being "between" two elements or layers, it can be the only element or layer between the two elements or layers, or one or more intervening elements or layers may also be present.

The terminology used herein is for the purpose of describing particular embodiments only and is not intended to be limiting of the present disclosure. As used herein, the singular forms "a" and "an" are intended to include the plural forms as well, unless the context clearly indicates otherwise. It will be further understood that the terms "comprises," "comprising," "have," "having," "includes," and "including," when used in this specification, specify the presence of the stated features, integers, steps, operations, elements, and/or components, but do not preclude the presence or addition of one or more other features, integers, steps, operations, elements, components, and/or groups thereof. As used herein, the term "and/or" includes any and all combinations of one or more of the associated listed items.

As used herein, the term "substantially," "about," "approximately," and similar terms are used as terms of approximation and not as terms of degree, and are intended to account for the inherent deviations in measured or calculated values that would be recognized by those of ordinary skill in the art. "About" or "approximately," as used herein, is inclusive of the stated value and means within an acceptable range of deviation for the particular value as determined by one of ordinary skill in the art, considering the measurement in question and the error associated with measurement of the particular quantity (i.e., the limitations of the measurement system). For example, "about" may mean within one or more standard deviations, or within ±30%, 20%, 10%, 5% of the stated value. Further, the use of "may" when describing embodiments of the present disclosure refers to "one or more embodiments of the present disclosure."

When a certain embodiment may be implemented differently, a specific process order may be performed differently from the described order. For example, two consecutively described processes may be performed substantially at the same time or performed in an order opposite to the described order.

The electronic or electric devices and/or any other relevant devices or components according to embodiments of the present disclosure described herein may be implemented utilizing any suitable hardware, firmware (e.g. an application-specific integrated circuit), software, or a combination of software, firmware, and hardware. For example, the various components of these devices may be formed on one integrated circuit (IC) chip or on separate IC chips. Further, the various components of these devices may be implemented on a flexible printed circuit film, a tape carrier package (TCP), a printed circuit board (PCB), or formed on one substrate. Further, the various components of these devices may be a process or thread, running on one or more processors, in one or more computing devices, executing computer program instructions and interacting with other system components for performing the various functionalities described herein. The computer program instructions are stored in a memory which may be implemented in a computing device using a standard memory device, such as, for example, a random access memory (RAM). The computer program instructions may also be stored in other non-transitory computer readable media such as, for example, a CD-ROM, flash drive, or the like. Also, a person of skill in the art should recognize that the functionality of various computing devices may be combined or integrated into a single computing device, or the functionality of a particular computing device may be distributed across one or more other computing devices without departing from the spirit and scope of the embodiments of the present disclosure.

Unless otherwise defined, all terms (including technical and scientific terms) used herein have the same meaning as commonly understood by one of ordinary skill in the art to which the present inventive concept belongs. It will be further understood that terms, such as those defined in commonly used dictionaries, should be interpreted as having a meaning that is consistent with their meaning in the context of the relevant art and/or the present specification, and should not be interpreted in an idealized or overly formal sense, unless expressly so defined herein.

FIG. 1 is a plan view illustrating an organic light emitting display device according to one embodiment.

Referring to FIG. 1, the organic light emitting display device may include a display panel 100, a main driver circuit 200, and a source driver circuit 300.

The display panel 100 may include a display part 110, a peripheral part 130, and a scan driver circuit 150.

The display part 110 includes plurality of pixels P, a plurality of scan lines SL1, SL2, . . . , SLN, a plurality of data lines DL1, DL2, . . . , DLM, and a plurality of power source lines VL1, VL2, . . . , VLK (wherein, N, M, and K are natural numbers).

The scan lines SL1, SL2, . . . , SLN extend in the row direction RD and are arranged in the column direction CD. The data lines DL1, DL2, . . . , DLM extend in the column direction CD and are arranged in the row direction RD. The power source lines VL1, VL2, . . . , VLK may extend in the column direction CD and may be arranged in the row direction RD, as shown in FIG. 1. Alternatively, the plurality of power source lines VL1, VL2, . . . , VLK may extend in the row direction RD and may be arranged in column direction CD. The plurality of power source lines VL1, VL2, ..., VLK may be connected to each other through a common connection line CCL formed in the peripheral part 130. The plurality of power source lines VL1, VL2, ..., VLK transfers a first power source voltage ELVDD among the display driving voltages.

The pixels P may be arranged in a matrix form including a plurality of pixel rows and a plurality of pixel columns.

Each pixel P includes a pixel circuit connected to a scan line, a data line, and a power source line, and the pixel circuit includes an organic light emitting diode and a driving transistor for driving the organic light emitting diode.

The peripheral part 130 may be defined as an area surrounding the display part 110. The scan driver circuit 150 may be located in a first peripheral area PA1 of the peripheral part 130 that is adjacent to an end portion of (e.g., one end of) the plurality of scan lines SL1, SL2, ..., SLN. The source driver circuit 300 may be located in a second peripheral area PA2 of the peripheral part 130 that is adjacent to the end portion of the plurality of data lines DL1, DL2, ..., DLM.

The scan driver circuit 150 includes a shift register connected to a plurality of scan lines SL1, SL2, ..., SLN, and is for sequentially outputting a scan signal to the scan lines SL1, SL2, ..., SLN. The scan driver circuit 150 may include a plurality of circuit transistors directly formed in the first peripheral area PA1 through the same manufacturing process as the transistors included in the pixel circuit.

The main driver circuit 200 includes a circuit board 210, a timing controller 230, and a voltage generator 250.

The circuit board 210 is electrically connected to the source driver circuit 300 located on the display panel 100.

The timing controller 230 may be located on the circuit board 210 and may generally control a driving mode of the organic light emitting display device.

The timing controller 230 may receive an original control signal and image data from an external graphics device. The timing controller 230 generates a plurality of control signals based on the original control signal. The plurality of control signals may include a source control signal for controlling the source driver circuit 300, and a scan control signal for controlling the scan driver circuit 150. The timing controller 230 may correct the image data using various correction algorithms, and may provide the corrected image data to the source driver circuit 300.

The voltage generator 250 generates a plurality of driving voltages for driving the organic light emitting display device using an external voltage. The plurality of driving voltages include a source driving voltage for driving the source driver circuit 300, a scan driving voltage for driving the scan driver circuit 150, and a display driving voltage provided to the display part 110.

The source driving voltage includes an analog power source voltage AVDD to generate a data voltage. The scan driving voltage includes a scan-on voltage that turns on a switching transistor of the pixel, and a scan-off voltage that turns off the switching transistor of the pixel. The display drive voltage includes a first power source voltage ELVDD of a high level, and a second power source voltage ELVSS of a low level.

As shown in FIG. 1, the voltage generator 250 transfers the first power source voltage ELVDD to the plurality of power source lines VL1, VL2, ..., VLK through the common connection line CCL.

The source driver circuit 300 includes a data driver 310 and a sensing driver 330.

The data driver 310 is connected to a plurality of data lines DL1, DL2, ..., DLM, and converts the image data provided from the timing controller 230 into a data voltage (s) using a gamma voltage(s). The data driver 310 outputs the data voltage to the plurality of data lines DL1, DL2, ..., DLM.

When the organic light emitting display device is driven in a sensing mode, the sensing driver 330 samples a sensing current corresponding to the first power source voltage ELVDD from the common voltage line CCL connecting the plurality of power source lines VL1, VL2, ..., VLK. The sensing driver 330 calculates a threshold voltage value for measuring the deterioration of the transistor included in the display part 110 using the sensing current. The sensing driver 330 may provide the threshold voltage value to the timing controller 230.

Figure 2:
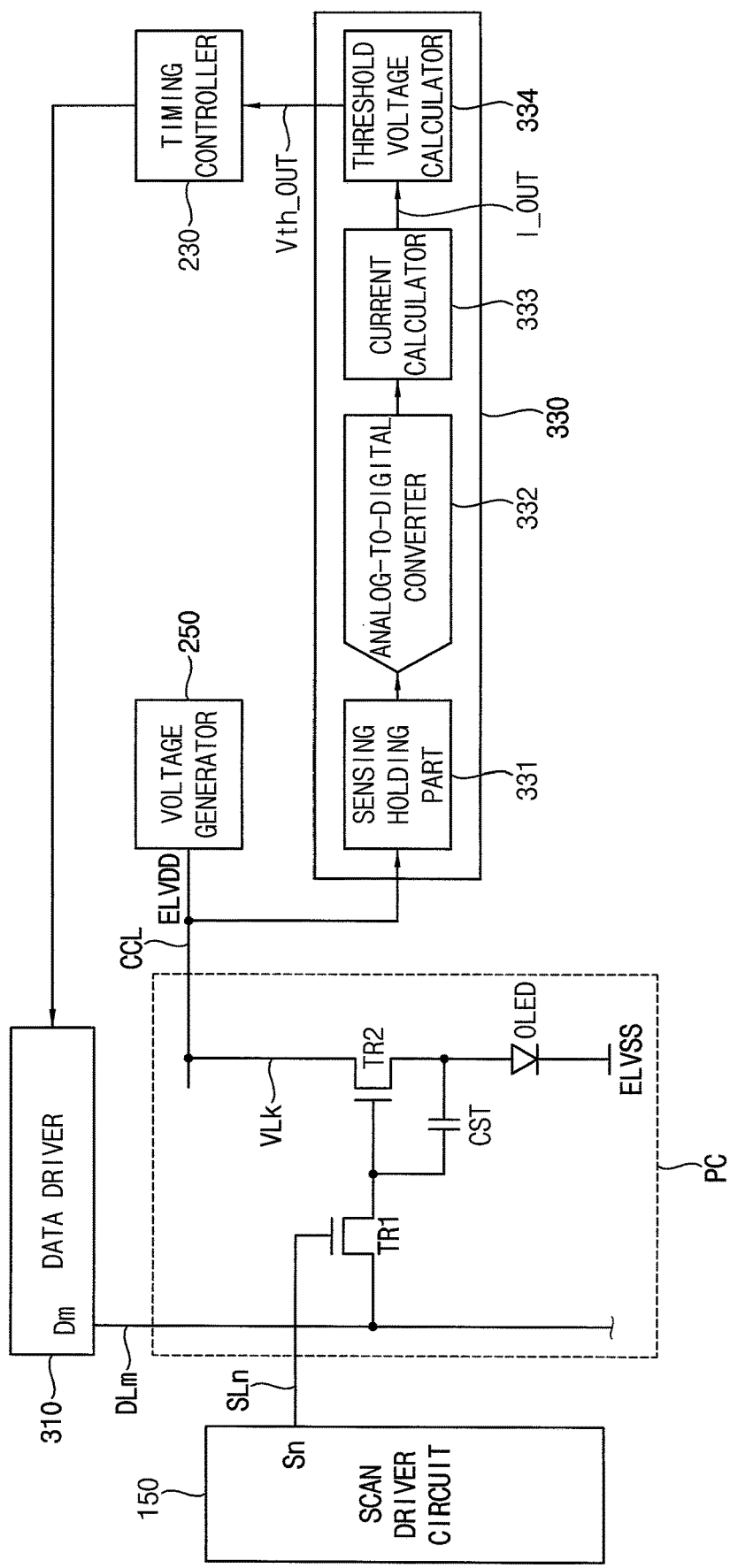
FIG. 2 is a block diagram illustrating an organic light emitting display device according to one embodiment.

FIG. 2 is a block diagram illustrating an organic light emitting display device according to one embodiment.

Referring to FIGS. 1 and 2, the organic light emitting display device may include a pixel circuit PC, a scan driver circuit 150, a data driver 310, a voltage generator 250, a sensing driver 330, and a timing controller 230.

Each of the plurality of pixels includes a pixel circuit PC.

The pixel circuit PC includes a first transistor TR1, a second transistor TR2, a storage capacitor CST, and an organic light emitting diode OLED. According to one embodiment, the pixel circuit PC may have a 2T1C structure having two transistors and one capacitor.

The first transistor TR1 includes a control electrode connected to an n-th scan line SLn, a first electrode connected to an m-th data line DLm, and a second electrode connected to the second transistor TR2 (wherein n and m are natural numbers). The first transistor TR1 is a switching transistor that switches the operation of a pixel circuit.

The second transistor TR2 includes a control electrode connected to the second electrode of the first transistor TR1, a first electrode connected to the power source line VLk, and a second electrode connected to an anode electrode of the organic light emitting diode OLED (wherein k is a natural number). The second transistor TR2 is a driving transistor that drives the organic light emitting diode OLED.

The storage capacitor CST includes a first electrode connected to the second electrode of the first transistor TR1, and a second electrode connected to the second electrode of the second transistor TR2.

The organic light emitting diode OLED includes an anode electrode connected to the second electrode of the second transistor, and a cathode electrode receiving the second power source voltage ELVSS.

The scan driver circuit 150 provides the scan signal Sn to the n-th scan line SLn.

The data driver 310 provides a data voltage Dm to the m-th data line DLm.

The voltage generator 250 provides the first power source voltage ELVDD to the common connection line CCL. The common connection line CCL connected to a k-th power source line VLk transfers the first power source voltage ELVDD to the pixel circuit PC.

The sensing driver 330 may be enabled in the sensing mode, and may be disabled in an image display mode.

The sensing driver 330 samples the sensing current corresponding to the first power source voltage ELVDD applied to the common connection line CCL. The sensing driver 330 calculates the threshold voltage value for measuring the deterioration of the transistor included in the display part

110 using the sensing current. The sensing driver 330 provides the threshold voltage value (e.g., Vth_OUT) to the timing controller 230.

The sensing driver 330 includes a sensing holding part 331, an analog-to-digital converter 332, a current calculator 333, and a threshold voltage calculator 334.

The sensing holding part 331 samples and holds a sensing current corresponding to the first power source voltage ELVDD applied to the common connection line CCL while a sensing data voltage is applied to one pixel, or a plurality of pixels, in the sensing mode. The sensing holding part 331 may include an integrator and a capacitor.

For example, the sensing holding part 331 samples and holds a first sensing current from the common connection line CCL while a first sensing data voltage is applied to one or a plurality of pixels. Then, the sensing holding part 331 samples and holds a second sensing current from the common connection line CCL while a second sensing data voltage, which is different from the first sensing data voltage, is applied to one or a plurality of pixels.

The analog-to-digital converter 332 converts the sampling signal provided from the sensing holding part 331 into digital data. For example, the analog-to-digital converter 332 outputs first sensing data corresponding to the first sensing current and second sensing data corresponding to the second sensing current.

The current calculator 333 converts the sensing data into a current value I_OUT. For example, the current calculator 333 converts the first sensing data to a first current value, and converts the second sensing data to a second current value. The first current value is the current value of the first power source voltage ELVDD corresponding to the first sensing data voltage, and the second current value is the current value of the first power source voltage ELVDD corresponding to the second sensing data voltage.

The threshold voltage calculator 334 may calculate a threshold voltage value of the driving transistor of the pixel circuit (i.e., the second transistor TR2) using at least two current values.

The threshold voltage value of the transistor may be defined using the gate voltage VG and the drain current $I_D$ based on the characteristics of the transistor defined by the following Equation.

$$I_D = K(V_G - V_{th})^2$$

$$\sqrt{I_D} = \sqrt{K}(V_G - V_{th})^2$$

In the Equation above, K is a proportional constant, $I_D$ is a drain current of the transistor, $V_G$ is a gate voltage of the transistor, and Vth is a threshold voltage of the transistor.

The threshold voltage calculator 334 calculates at least two points defined by at least two gate voltages, and at least two current values corresponding to at least two sensing data voltages. The threshold voltage calculator 334 calculates a slope of at least two points, and calculates the threshold voltage value Vth_OUT using the slope.

The timing controller 230 calculates a correction offset value according to the deterioration of the driving transistor included in the display part 110 using the threshold voltage value. The timing controller 230 applies the correction offset value to the image data to calculate the corrected image data.

Figure 3A:
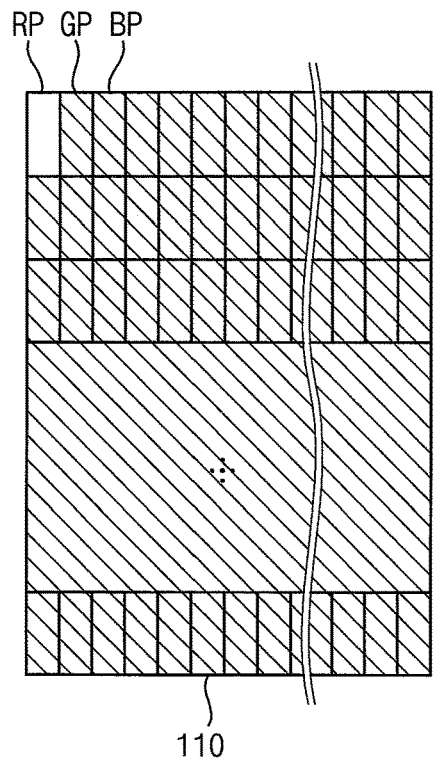
FIGS. 3A and 3B are conceptual diagrams illustrating a method of driving a display part in a sensing mode according to one embodiment.
Figure 3B:
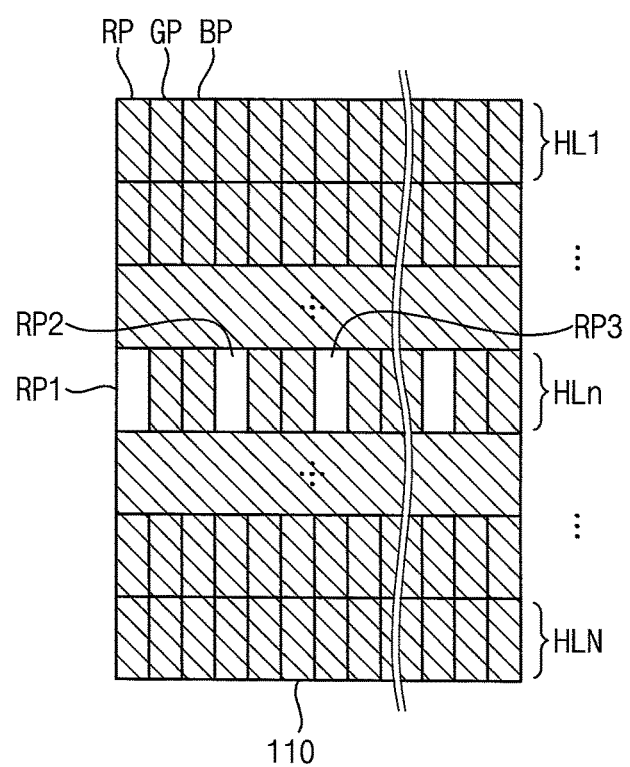

FIGS. 3A and 3B are conceptual diagrams illustrating a method of driving a display part in a sensing mode according to one embodiment.

Referring to FIGS. 2 and 3A, the display part 110 may include a plurality of color pixels, for example, a red pixel RP, a green pixel GP, and a blue pixel BP.

According to one embodiment, in the sensing mode, a threshold voltage value may be calculated by driving one color pixel (e.g., the red pixel RP) selected among the plurality of pixels of the display part 110.

The scan driver circuit 150 and the data driver 310 respectively apply a first scan-on voltage and a first sensing data voltage to the scan line and the data line connected to the selected color pixel/red pixel RP. The sensing driver 330 samples the first sensing current corresponding to the first sensing data voltage while the selected color pixel RP is driven. The sensing driver 330 converts the first sensing current into a first current value, which is a digital signal.

Then, the scan driver circuit 150 and the data driver 310 respectively apply a second scan-on voltage and a second sensing data voltage to the scan line and data line connected to the selected color pixel RP. The sensing driver 330 samples the second sensing current corresponding to the second sensing data voltage while the selected color pixel RP is driven. The sensing driver 330 converts the second sensing current into a second current value, which is a digital signal.

The sensing driver 330 may calculate the threshold voltage value of the second transistor TR2 included in the selected color pixel RP using the first and second current values.

When the selected color pixel is a red pixel PR, the threshold voltage value may be used to calculate a red correction offset value for correcting the image data of the red pixel. In the same manner, the threshold voltage value of the green pixel or the blue pixel is calculated, and the threshold voltage value of the green pixel or the blue pixel may be used to calculate the green or blue correction offset value for correcting the image data of the green pixel or the blue pixel, respectively.

According to one embodiment, referring to FIGS. 2 and 3B, in the sensing mode, a threshold voltage value corresponding to pixels of at least one selected horizontal line (e.g., an n-th horizontal line HLn) among a plurality of horizontal lines HL1, . . . , HLN of the display part 110 may be calculated. For example, a threshold voltage value corresponding to the red pixels RP1, RP2, . . . included in the n-th horizontal line HLn may be calculated.

The scan driver circuit 150 respectively applies a first scan-on voltage and a first sensing data voltage to the n-th scan line and the plurality of data lines connected to the red pixels RP1, RP2, . . . of the selected n-th horizontal line HLn. The red pixels RP1, RP2, . . . receive the same first sensing data voltage. The sensing driver 330 samples a first sensing current corresponding to the first sensing data voltage while the red pixels RP1, RP2, . . . of the n-th horizontal line HLn are driven. The sensing driver 330 converts the first sensing current into a first current value, which is a digital signal.

The scan driver circuit 150 respectively applies a second scan-on voltage and a second sensing data voltage to the n-th scan line and the plurality of data lines connected to the red pixels RP1, RP2, . . . of the selected n-th horizontal line HLn. The red pixels RP1, RP2, . . . receive the same second sensing data voltage. The sensing driver 330 samples a second sensing current corresponding to the second sensing data voltage while the red pixels RP1, RP2, . . . of the n-th horizontal line HLn are driven. The sensing driver 330 converts the second sensing current into a second current value, which is a digital signal.

The sensing driver 330 may calculate the threshold voltage value of the red pixels RP1, RP2, . . . of the n-th horizontal line HLn using the first and second current values.

The threshold voltage value calculated for the red pixels RP1, RP2, . . . may be used to calculate a red correction offset value for correcting the image data of the red pixel. In the same manner, the threshold voltage value of the green pixel or the blue pixel in a horizontal line is calculated, and the calculated threshold voltage value of the green pixel or the blue pixel may be used to calculate the green or blue correction offset value for correcting the image data of the green pixel or the blue pixel.

Figure 4A:
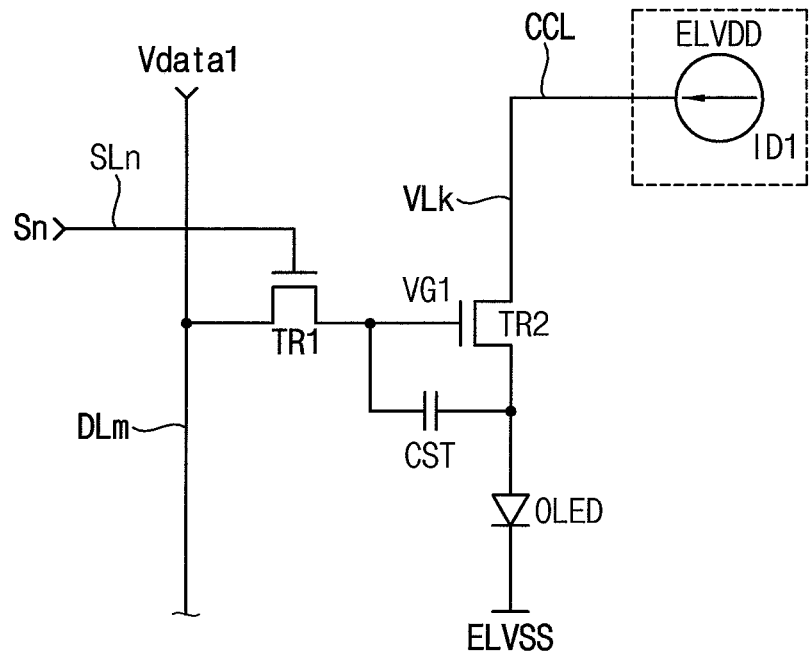
FIGS. 4A and 4B are pixel circuit diagrams illustrating a method of sensing a power source current in a sensing mode according to one embodiment.
Figure 4B:
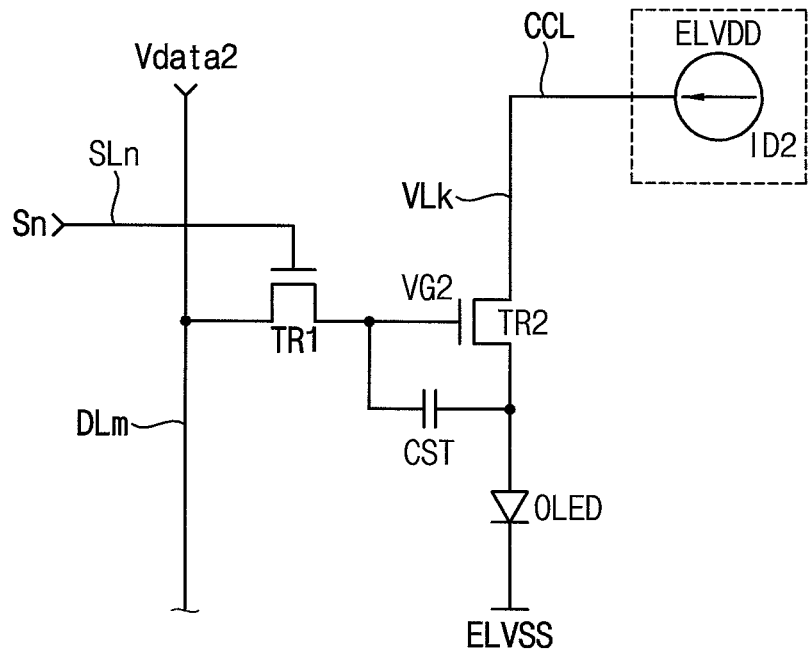
Figure 5:
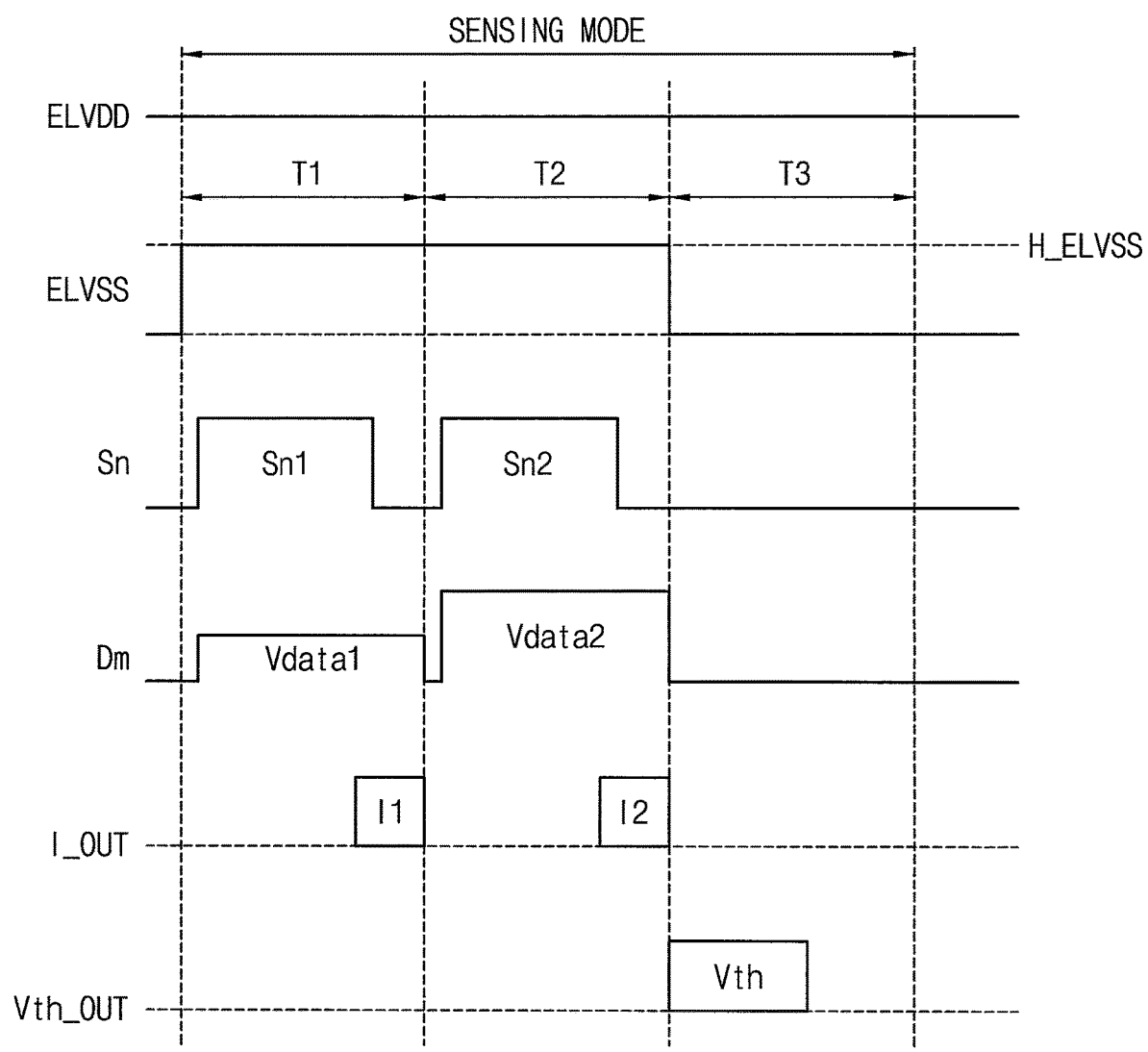
FIG. 5 is a waveform diagram illustrating a method of sensing a power source current in a sensing mode according to one embodiment.
Figure 6:
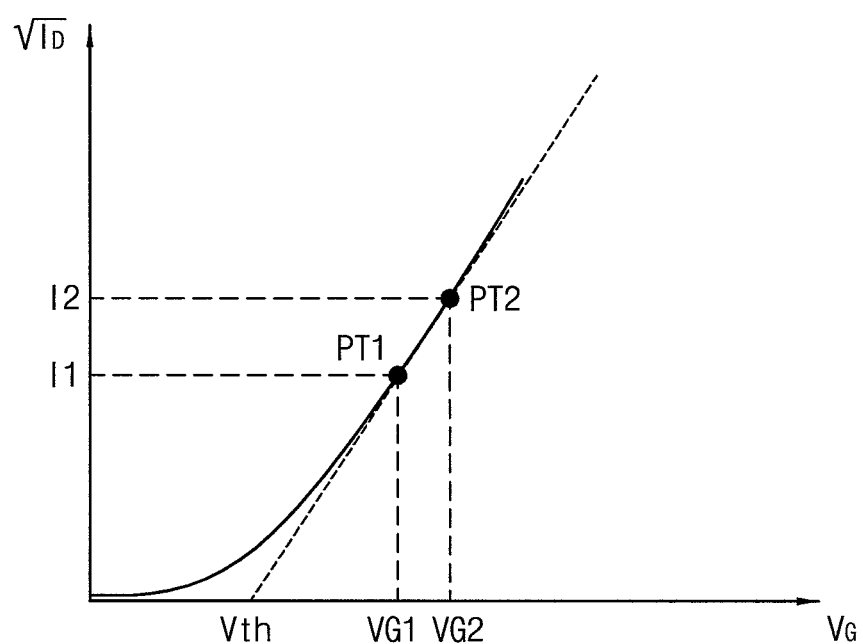
FIG. 6 is a graph diagram illustrating a drain current to a gate voltage of a transistor according to one embodiment.

FIGS. 4A and 4B are pixel circuit diagrams illustrating a method of sensing a power source current in a sensing mode according to one embodiment. FIG. 5 is a waveform diagram illustrating a method of sensing a power source current in a sensing mode according to one embodiment. FIG. 6 is a graph diagram illustrating a drain current to a gate voltage of a transistor according to one embodiment.

Referring to FIGS. 4A and 5, in a first period T1 of the sensing mode, the scan line SLn receives the first scan-on voltage Sn1 and the data line Dm receives the first sensing data voltage Vdata1.

The first transistor TR1 is turned on in response to the first scan-on voltage Sn1, and the voltage corresponding to the first sensing data voltage Vdata1 is applied to the gate electrode of the second transistor TR2. The gate electrode of the second transistor TR2 has a first gate voltage VG1 corresponding to the first sensing data voltage Vdata1.

However, in response to the first gate voltage VG1, the second transistor TR2 is turned on, and a first power source voltage ELVDD is applied to the drain electrode of the second transistor TR2 through the power source line VLk. The first power source current ID1 corresponding to the first gate voltage VG1 flows from the drain electrode of the second transistor TR2 toward the source electrode of the second transistor TR2.

The sensing holding part 331 samples and holds the first sensing current corresponding to the first power source current ID1. The analog-to-digital converter 332 converts the sampled signal into a first sensing data, which is a digital signal. The current calculator 333 converts the first sensing data to a first current value I1.

Referring to FIGS. 4B and 5, in a second period T2 of the sensing mode, the scan line SLn receives the second scan-on voltage Sn2, and the data line Dm receives the second sensing data voltage Vdata2. The second sensing data voltage Vdata2 has a different level than the first sensing data voltage Vdata1.

The first transistor TR1 is turned on in response to the second scan-on voltage Sn2, and the voltage corresponding to the second sensing data voltage Vdata2 is applied to the gate electrode of the second transistor TR2. The gate electrode of the second transistor TR2 has a second gate voltage VG2 corresponding to the second sensing data voltage Vdata2.

However, in response to the second gate voltage VG2, the second transistor TR2 is turned on, and the first power source voltage ELVDD is applied to the drain electrode of the second transistor TR2 through the power source line VLk. The second power source current ID2 corresponding to the second gate voltage VG2 flows from the drain electrode of the second transistor TR2 toward the source electrode of the second transistor TR2.

The sensing holding part 331 samples and holds the second sensing current corresponding to the second power source current ID2. The analog-to-digital converter 332 converts the sampled signal into second sensing data, which is a digital signal. The current calculator 333 converts the second sensing data to a second current value I2.

However, in the first period T1 and the second period T2 of the sensing mode, a high level of the second power source voltage H_ELVSS may be applied to the cathode electrode the organic light emitting diode OLED to prevent the OLED from emitting the light by the first and second sensing data voltage Vdata1 and Vdata2. The high-level of the second power source voltage H_ELVSS may be preset to a level for non-emission of the organic light emitting diode OLED.

Referring to FIG. 6, in a third period T3 of the sensing mode, the threshold voltage calculator 334 calculates a first point PT1 and a second point PT2. The first point PT1 includes a first gate voltage VG1 that is an x-coordinate value, and the first current value I1 that is a y-coordinate value. The second point PT2 includes a second gate voltage VG2 that is the x-coordinate value, and the second current value I2 that is the y-coordinate value. The threshold voltage calculator 334 calculates a slope of the first and second points. The threshold voltage calculator 334 calculates a threshold voltage value Vth of the second transistor TR2 using the slope.

Figure 7:
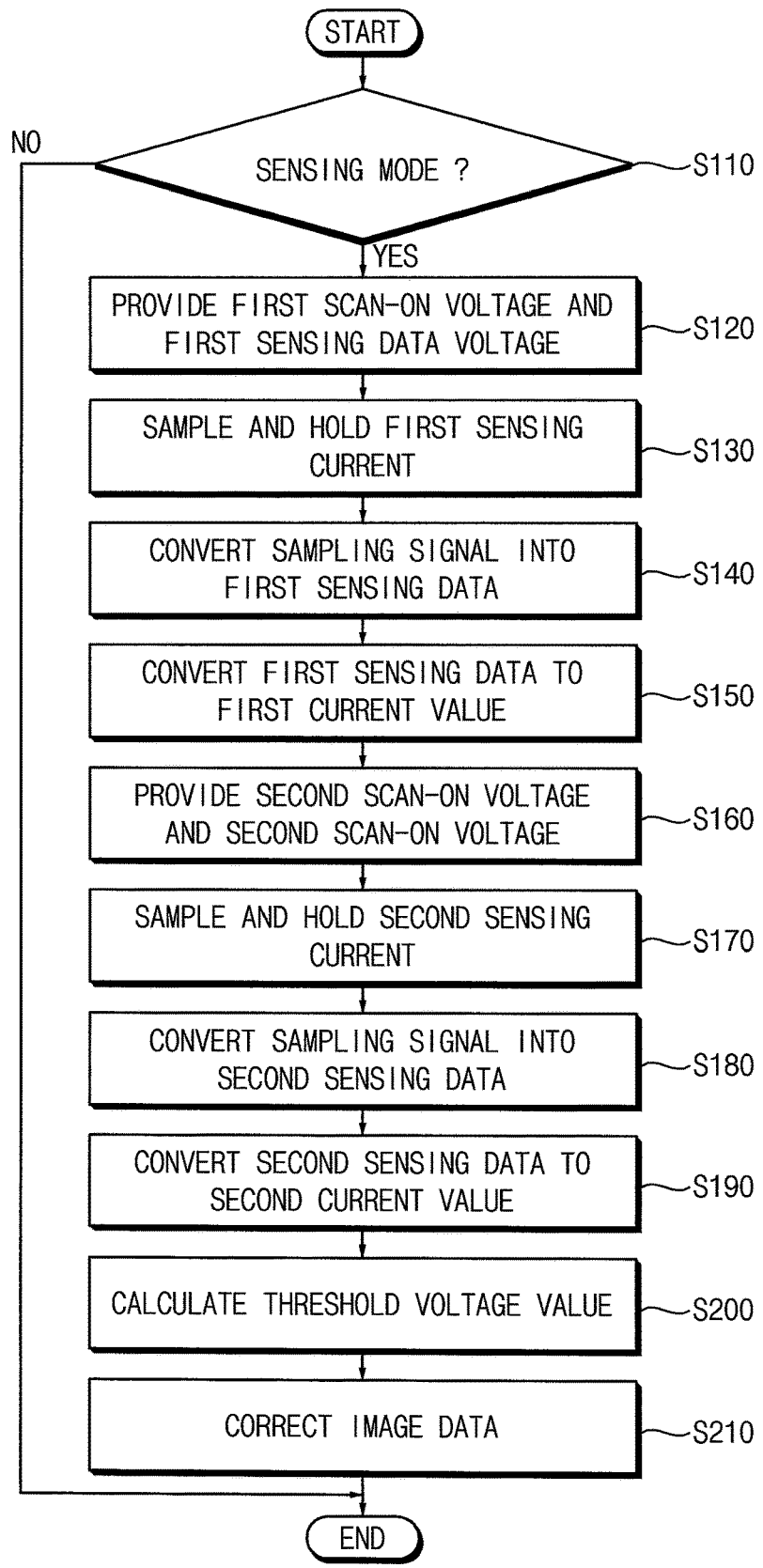
FIG. 7 is a flowchart illustrating a method of driving an organic light emitting display device according to one embodiment.

FIG. 7 is a flowchart illustrating a method of driving an organic light emitting display device according to one embodiment.

The driving mode of the organic light emitting display device includes an image display mode for displaying a general image, and a sensing mode for sensing deterioration of a transistor included in the pixel circuit.

The sensing mode may occur in the power off state of the organic light emitting display device, or may occur in the vertical blank period of the image display mode.

Referring to FIGS. 2 and 7, in the sensing mode, a method of sensing the degradation of a transistor included in a pixel circuit may be described.

When the organic light emitting display device is in the sensing mode (110), the scan driver circuit 150 provides the first scan-on voltage Sn1 to the scan line SLn, and the data driver 310 provides the first sensing data voltage Vdata1 to the data line Dm in a first period (S120). Then, The first transistor TR1 is turned on in response to the first scan-on voltage Sn1, and a first gate voltage VG1 corresponding to the first sensing data voltage Vdata1 is applied to the gate electrode of the second transistor TR2. The first power source current ID1 corresponding to the first gate voltage VG1 flows from the drain electrode of the second transistor TR2 to the source electrode of the second transistor TR2.

The sensing holding part 331 samples and holds the first sensing current corresponding to the first power source current ID1 (S130). The analog-to-digital converter 332 converts the sampling signal into first sensing data, which is a digital signal (S140). The current calculator 333 converts the first sensing data to the first current value I1 (S150).

In a second period of the sensing mode, the scan driver circuit 150 provides the second scan-on voltage Sn2 to the scan line SLn, and the data driver 310 provides the second sensing data voltage Vdata2 to the data line Dm (S160). The first transistor TR1 is turned on in response to the second scan-on voltage Sn2, and a second gate voltage VG2 corresponding to the second sensing data voltage Vdata2 is applied to the gate electrode of the second transistor TR2. The second power source current ID2 corresponding to the second gate voltage VG2 flows from the drain electrode of the second transistor TR2 to the source electrode of the second transistor TR2.

The sensing holding part 331 samples and holds the second sensing current corresponding to the second power source current ID2 (S170). The analog-to-digital converter 332 converts the sampled signal into second sensing data, which is a digital signal (S180). The current calculator 333 converts the second sensing data to a second current value I2 (S190).

In a third period T3 of the sensing mode, the threshold voltage calculator 334 calculates a first point PT1 and a second point PT2. The first point PT1 includes a first gate voltage VG1 that is an x-coordinate value and the first current value I1 that is a y-coordinate value. The second point PT2 includes a second gate voltage VG2 that is the x-coordinate value and the second current value I2 that is the y-coordinate value. The threshold voltage calculator 334 calculates a slope of the first and second points. The threshold voltage calculator 334 calculates the threshold voltage value Vth of the second transistor TR2 using the slope (S200).

The timing controller 230 calculates a correction offset value due to deterioration of the second transistor included in the display part 110 using the threshold voltage value, and corrects the image data using the correction offset value (S210).

According to embodiments of the present disclosure, the power supply current flowing in the power source line of the display part may be sensed, and the threshold voltage for measuring the deterioration of the transistor may be calculated using the sensed power supply current. In addition, a high-resolution display panel may be manufactured without adding a sensing transistor and a sensing line to a pixel circuit.

The present disclosure may be applied to a display device, and to an electronic device having the display device. For example, the present disclosure may be applied to a computer monitor, a laptop, a digital camera, a cellular phone, a smart phone, a smart pad, a television, a personal digital assistant (PDA), a portable multimedia player (PMP), a MP3 player, a navigation system, a game console, a video phone, etc.

The foregoing is illustrative of the present disclosure and is not to be construed as limiting thereof. Although a few embodiments of the present disclosure have been described, those skilled in the art will readily appreciate that many modifications are possible in the embodiments without materially departing from the novel teachings and advantages of the present disclosure. Accordingly, all such modifications are intended to be included within the scope of the present disclosure as defined in the claims. In the claims, means-plus-function clauses are intended to cover the structures described herein as performing the recited function and not only structural equivalents but also equivalent structures. Therefore, it is to be understood that the foregoing is illustrative of the present disclosure and is not to be construed as limited to the specific embodiments disclosed, and that modifications to the disclosed embodiments, as well as other embodiments, are intended to be included within the scope of the appended claims. The present disclosure is defined by the following claims, with equivalents of the claims to be included therein.

What is claimed is:

1. An organic light emitting display device comprising:
   a display part comprising a plurality of scan lines, a plurality of data lines, a plurality of power source lines for receiving power from a power source, and a plurality of pixels each comprising an organic light emitting diode, a driving transistor coupled to the organic light emitting diode and to a power source line of the power source lines, and a switching transistor coupled to a scan line of the scan lines and to a data line of the data lines; and
   a sensing driver configured to sample a first sensing current from the power source line while a first sensing data voltage is applied to one of the pixels, and to sample a second sensing current from the power source line while a second sensing data voltage that is greater than the first sensing data voltage is applied to the one of the pixels, and to calculate a threshold voltage value of the driving transistor using both of the first sensing current and the second sensing current in a sensing mode, the sensing driver being connected to a point between the power source and a driving transistor of the one of the pixels.

2. The organic light emitting display device of claim 1, further comprising:
   a data driver configured to respectively apply sensing data voltages that are different from each other to the data line in at least two periods of the sensing mode; and
   a scan driver circuit configured to respectively apply a scan-on voltage to the scan line at least two times respectively corresponding to the at least two periods of the sensing mode.

3. The organic light emitting display device of claim 1, wherein, in a first period of the sensing mode, the first sensing data voltage is applied to the data line, a first scan-on voltage is applied to the scan line in synchronization with the first sensing data voltage, and a power source voltage is applied to the power source line.

4. The organic light emitting display device of claim 3, wherein, in the first period, the sensing driver is configured to sample the first sensing current corresponding to the first sensing data voltage from the power source line, and to convert the first sensing current to a first current value.

5. The organic light emitting display device of claim 4, wherein, in a second period of the sensing mode, the second sensing data voltage that is different from the first sensing data voltage is applied to the data line, a second scan-on voltage is applied to the scan line in synchronization with the second sensing data voltage, and a power source voltage is applied to the power source line.

6. The organic light emitting display device of claim 5, wherein, in the second period, the sensing driver is configured to sample the second sensing current corresponding to the second sensing data voltage from the power source line, and to convert the second sensing current to a second current value.

7. The organic light emitting display device of claim 6, wherein the sensing driver is configured to:
   calculate a first point that comprises a first gate voltage being an x-coordinate value and the first current value being a y-coordinate value;
   calculate a second point that comprises a second gate voltage being an x-coordinate value and the second current value being a y-coordinate value;
   calculate a slope of the first and second points; and
   calculate a threshold voltage value of the driving transistor using the slope.

8. The organic light emitting display device of claim 1, further comprising a timing controller configured to calculate a correction offset value using the threshold voltage value, and to correct image data using the correction offset value.

9. The organic light emitting display device of claim 1, wherein the switching transistor comprises a control electrode coupled to the scan line, a first electrode coupled to the data line, and a second electrode, and
   wherein the driving transistor comprises the control electrode coupled to the second electrode of the switching transistor, a first electrode coupled to the power source line, and a second electrode coupled to an anode electrode of the organic light emitting diode.

10. The organic light emitting display device of claim 9, wherein each of the pixels further comprises a storage capacitor connected between the control electrode of the driving transistor and the second electrode of the driving transistor.

11. The organic light emitting display device of claim 1, wherein the plurality of power source lines are coupled to each other through a common connection line formed in a peripheral part surrounding the display part, and wherein the sensing driver samples a sensing current from the common connection line.

12. A method of driving an organic light emitting display device that comprises a scan line, a data line, a power source line for receiving power from a power source, and a pixel comprising an organic light emitting diode, a driving transistor coupled to the organic light emitting diode and to a power source line, and a switching transistor coupled to a scan line and to a data line, the method comprising:

sampling a first sensing current from the power source line at a point between the power source and a driving transistor of the pixel while a first sensing data voltage is applied to the pixel in a sensing mode;

sampling a second sensing current from the power source line at the point between the power source and the driving transistor of the pixel while a second sensing data voltage that is greater than the first sensing data voltage is applied to the pixel in the sensing mode; and calculating a threshold voltage value of the driving transistor using both of the first sensing current and the second sensing current in the sensing mode.

13. The method of claim 12, further comprising:

respectively applying sensing data voltages that are different from each other to the data line in at least two periods of the sensing mode; and respectively applying a scan-on voltage to the scan line at least two times respectively corresponding to the at least two periods of the sensing mode.

14. The method of claim 12, further comprising:

applying the first sensing data voltage to the data line in a first period of the sensing mode;

applying a first scan-on voltage to the scan line in synchronization with the first sensing data voltage in the first period; and applying a power source voltage to the power source line in the first period.

15. The method of claim 14, further comprising:

sampling the first sensing current corresponding to the first sensing data voltage from the power source line in the first period; and converting the first sensing current to a first current value in the first period.

16. The method of claim 15, further comprising:

applying the second sensing data voltage that is different from the first sensing data voltage to the data line in a second period of the sensing mode;

applying a second scan-on voltage to the scan line in synchronization with the second sensing data voltage in the second period; and applying a power source voltage is applied to the power source line in the second period.

17. The method of claim 16, further comprising:

sampling the second sensing current corresponding to the second sensing data voltage from the power source line in the second period; and converting the second sensing current to a second current value in the second period.

18. The method of claim 17, further comprising:

calculating a first point that comprises a first gate voltage being an x-coordinate value and the first current value being a y-coordinate value in a third period of the sensing mode;

calculating a second point that comprises a second gate voltage being an x-coordinate value and the second current value being a y-coordinate value in the third period;

calculating a slope of the first and second points in the third period; and calculating a threshold voltage value of the driving transistor using the slope in the third period.

19. The method of claim 12, further comprising:

calculating a correction offset value using the threshold voltage value; and correcting image data using the correction offset value.

20. The method of claim 12, wherein a plurality of power source lines are coupled to each other through a common connection line formed in a peripheral part surrounding a display part of the organic light emitting display device, and wherein the first sensing current and the second sensing current are sampled from the common connection line.

* * * * *